(12) United States Patent
Peng et al.

(10) Patent No.: US 10,453,754 B1
(45) Date of Patent: Oct. 22, 2019

(54) DIFFUSED CONTACT EXTENSION DOPANTS IN A TRANSISTOR DEVICE

(71) Applicant: GLOBALFOUNDRIES Inc., Grand Cayman (KY)

(72) Inventors: Jianwei Peng, Latham, NY (US); Haigou Huang, Rexford, NY (US); Qun Gao, Clifton Park, NY (US); Xin Wang, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/021,660

(22) Filed: Jun. 28, 2018

(51) Int. Cl.
*H01L 21/8238* (2006.01)
*H01L 29/66* (2006.01)
*H01L 21/324* (2006.01)
*H01L 21/02* (2006.01)
*H01L 21/225* (2006.01)

(52) U.S. Cl.
CPC ............. *H01L 21/823814* (2013.01); *H01L 21/02129* (2013.01); *H01L 21/02532* (2013.01); *H01L 21/2255* (2013.01); *H01L 21/324* (2013.01); *H01L 21/823821* (2013.01); *H01L 29/66636* (2013.01); *H01L 29/66795* (2013.01)

(58) Field of Classification Search
None
See application file for complete search history.

(56) References Cited

U.S. PATENT DOCUMENTS

| | | |
|---|---|---|
| 4,679,300 A | 7/1987 | Chan et al. |
| 6,576,516 B1 | 6/2003 | Blanchard |
| 9,059,218 B2 | 6/2015 | Krishnan et al. |
| 9,373,705 B1 * | 6/2016 | Chen ............... H01L 29/66795 |
| 9,455,204 B1 | 9/2016 | Cao et al. |
| 9,698,018 B1 | 7/2017 | Dai et al. |
| 2008/0308861 A1 * | 12/2008 | Nawaz ............ H01L 29/66795 257/327 |
| 2014/0151804 A1 * | 6/2014 | Meiser ............ H01L 29/66795 257/347 |

* cited by examiner

*Primary Examiner* — Anthony Ho
*Assistant Examiner* — Kevin Quinto
(74) *Attorney, Agent, or Firm* — Amerson Law Firm, PLLC

(57) ABSTRACT

The present disclosure is directed to various methods of diffusing contact extension dopants in a transistor device and the resulting devices. One illustrative method includes forming a first contact opening between two adjacent gate structures formed above a first fin, the first contact opening exposing a first region of the first fin, forming a first contact recess in the first region, forming a first doped liner in the first contact recess, performing an anneal process to diffuse dopants from the first doped liner into the first fin to form a first doped contact extension region in the first fin, and performing a first epitaxial growth process to form a first source/drain region in the first contact recess.

16 Claims, 7 Drawing Sheets

DIFFUSED CONTACT EXTENSION DOPANTS IN A TRANSISTOR DEVICE

BACKGROUND

1 Field of the Disclosure

The present disclosure generally relates to the fabrication of semiconductor devices, and, more particularly, to methods for diffusing contact extension dopants in a transistor device and the resulting devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, finFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1 is a perspective view of an illustrative prior art finFET semiconductor device 100 that is formed above a semiconductor substrate 105 at an intermediate point during fabrication. In this example, the finFET device 100 includes three illustrative fins 110, an isolation material 130, a gate structure 115, sidewall spacers 120 and a gate cap layer 125. The fins 110 have a three-dimensional configuration: a height, a width, and an axial length. The portions of the fins 110 covered by the gate structure 115 are the channel regions of the finFET device 100, while the portions of the fins 110 positioned laterally outside of the spacers 120 are part of the source/drain regions of the device 100. Although not depicted, the portions of the fins 110 in the source/drain regions may have additional epi semiconductor material formed thereon in either a merged or unmerged condition.

In an integrated circuit device, there are different performance requirements for different functional blocks or regions of the device, i.e., there may be different performance specifications for devices formed in a logic region as compared to devices formed for input/output circuitry or in a memory region. It is useful to provide different characteristics for the source/drain contacts for the NMOS and PMOS transistors. One technique involves implanting different dopants into the contact regions of NMOS and PMOS devices. Such extension implants are costly due to the need for additional mask layers and may cause fin and gate damage.

The present disclosure is directed to various methods and resulting devices that may avoid, or at least reduce, the effects of one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of diffusing contact extension dopants in a transistor device and the resulting devices. One illustrative method includes forming a first contact opening between two adjacent gate structures formed above a first fin, the first contact opening exposing a first region of the first fin, forming a first contact recess in the first region, forming a first doped liner in the first contact recess, performing an anneal process to diffuse dopants from the first doped liner into the first fin to form a first doped contact extension region in the first fin, and performing a first epitaxial growth process to form a first source/drain region in the first contact recess.

Another illustrative method includes forming a first mask layer exposing a first fin and covering a second fin, forming a first contact opening between two adjacent gate structures formed above the first fin, the first contact opening exposing a first region of the first fin, forming a first contact recess in the first region, forming a first doped liner in the first contact opening and the first contact recess and above the first mask layer, forming a second mask layer in the first contact recess and a lower portion of the first contact opening, the second mask layer exposing an upper portion of the first contact opening, removing a portion of the first doped liner exposed by the second mask layer from the upper portion and from above the first mask layer, removing the first and second mask layers, performing an anneal process to diffuse dopants from the first doped liner into the first fin to form a first doped contact extension region in the first fin, and performing a first epitaxial growth process to form a first source/drain region in the first contact recess.

BRIEF DESCRIPTION OF THE DRAWINGS

The disclosure may be understood by reference to the following description taken in conjunction with the accompanying drawings, in which like reference numerals identify like elements, and in which.

Figure 1:
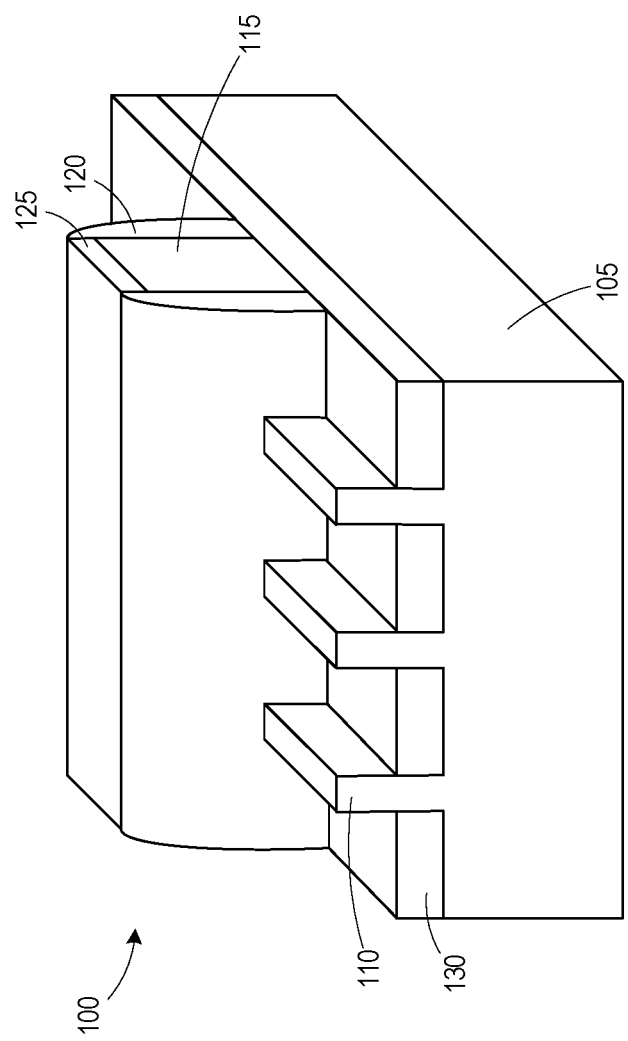
FIG. 1 schematically depicts an illustrative prior art finFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of diffusing contact extension dopants in a transistor device and the resulting devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 2A-2F illustrate various illustrative methods disclosed herein for forming an integrated circuit product 200 having transistor devices with different contact extension dopants. In the illustrated embodiment, the product includes finFET transistor devices, but the techniques described herein are not so limited, and they may be applied to other types of devices, such as planar devices. FIGS. 2A-2I show a cross-sectional view of the product 200 taken through the long axis of one of a first fin 205A formed in a substrate 210 in a first device region 215A and a second fin 205B formed in the substrate 210 in a second device region 215B, with an isolation structure 220 formed therebetween. The cross-sectional view is taken in a direction corresponding to the gate length direction of the product 200. In some cases, the fins 205A, 205B may be portions of the same originally formed fin that extend across both of the device regions 215A, 215B, wherein the originally formed fin is later cut to define the fins 205A, 205B. In other cases, the fins 205A, 205B may each be a part of a different originally formed fin.

Illustrative gate structures 220A, 220B are formed above the fins 205A, 205B. The gate structures 220A, 220B may each include a gate electrode material 225A, 225B (e.g., a sacrificial material for a replacement gate technique or a conductive material for a gate first technique) and a gate insulation layer (not separately shown). Also depicted are illustrative gate cap layers 230A, 230B and sidewall spacers 235A, 235B, both of which may be made of a material such as silicon nitride. The size and materials of construction for the gate structures 220A, 220B may be the same or different in the different device regions 215A, 215B. In the illustrated embodiment, the gate structure 220A and the fin 215A are for an PMOS device 240P, and the gate structure 220B and the fin 215B are for an NMOS device 240N.

The space between adjacent gate structures 220A defines source/drain contact openings 245A, and the space between adjacent gate structures 220B define source/drain contact openings 245B. The contact openings 245A, 245B expose source/drain regions of the respective fins 205A, 205B. In the illustrated example, a self-aligned process is employed using the respective gate structures 220A, 220B and spacers 235A, 235B as an etch mask for removing insulating material (not shown) to define the source/drain contact openings 245A, 245B. Additionally, various doped regions, e.g., halo implant regions, well regions and the like, may be formed, but are not depicted in the attached drawings. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. The substrate 210 may be formed of silicon or silicon germanium or it may be made of materials other than silicon, such as germanium. Thus, the terms "substrate" or "semiconductor substrate" should be understood to cover all semiconducting materials and all forms of such materials. The substrate 210 may have different layers. For example, the fins 205A, 205B may be formed in a process layer formed above the base layer of the substrate 210.

Figure 2A:
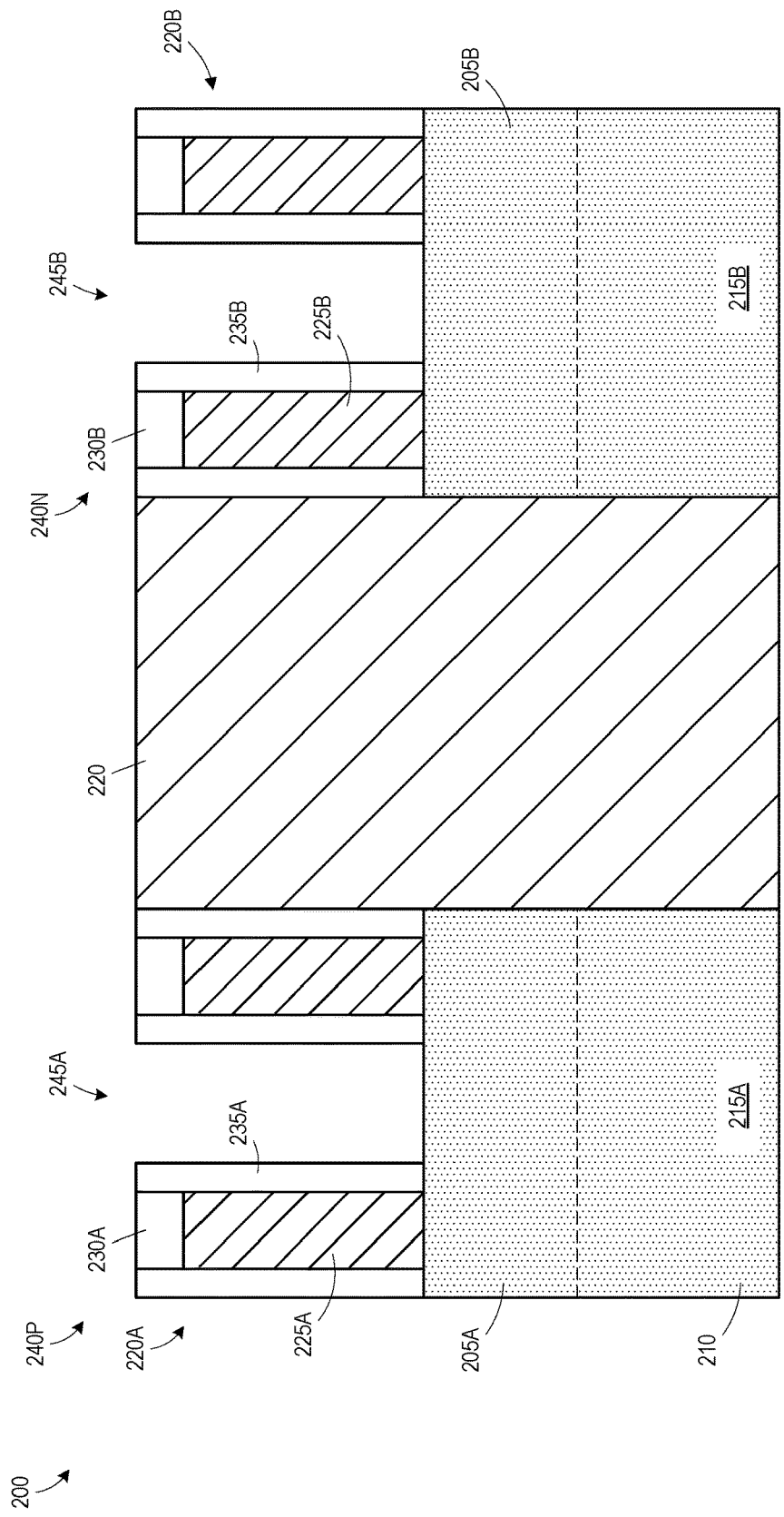
FIGS. 2A-2F depict a method disclosed herein of diffusing contact extension dopants in a transistor device.
Figure 2B:
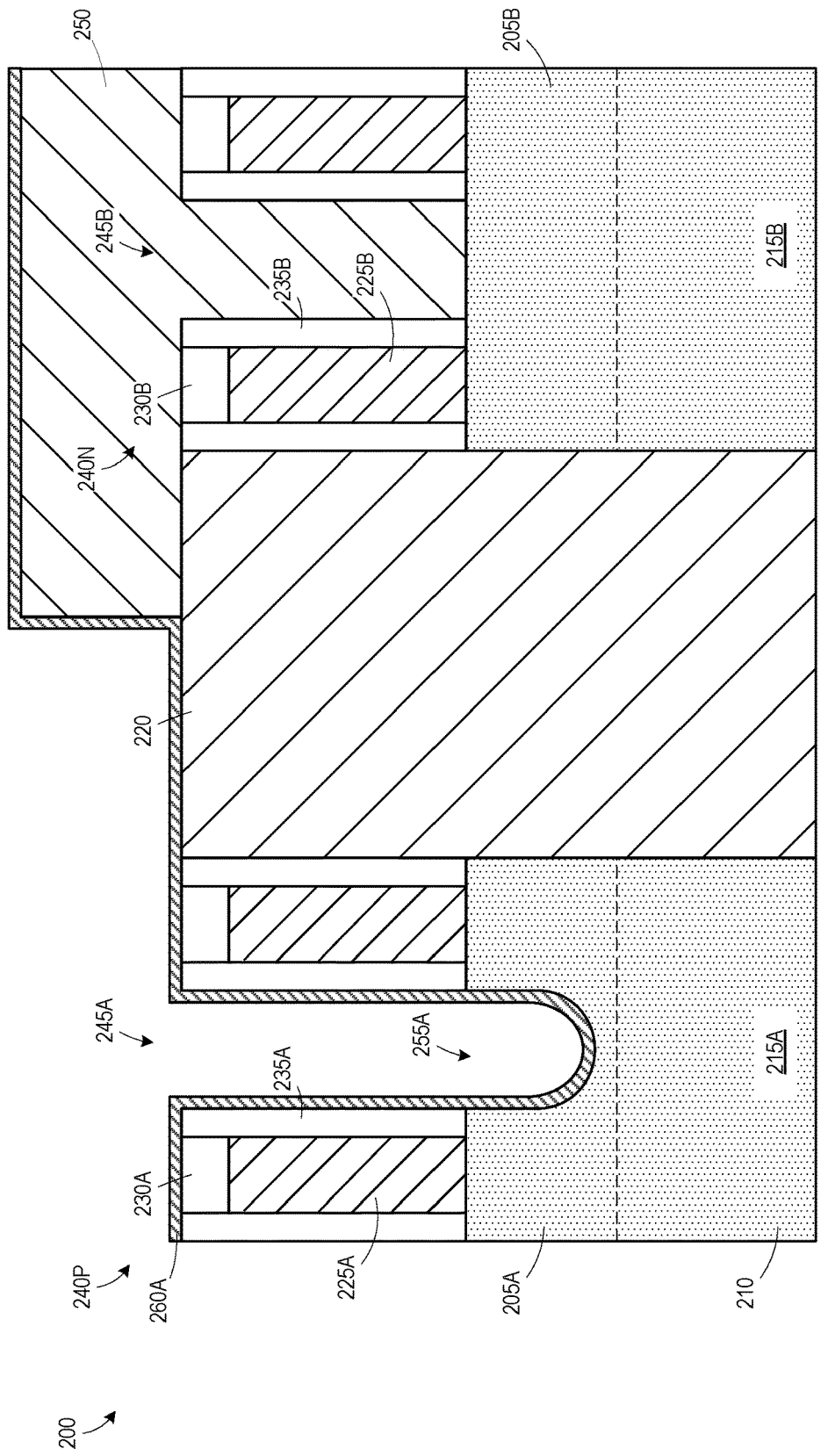

FIG. 2B illustrates the product 200 after several processes were performed. A mask layer 250 (e.g., organic patterning layer (OPL)) was formed covering the NMOS device 240N and exposing the PMOS device 240P. An anisotropic etch process (e.g., reactive ion etch) was performed to define a contact recess 255A in the fin 205A. A deposition process was performed to form a first doped liner 260A (e.g., boron silicate glass (BSG)) lining the contact opening 245A and the contact recess 255A and above the isolation structure 220 and mask layer 250.

Figure 2C:
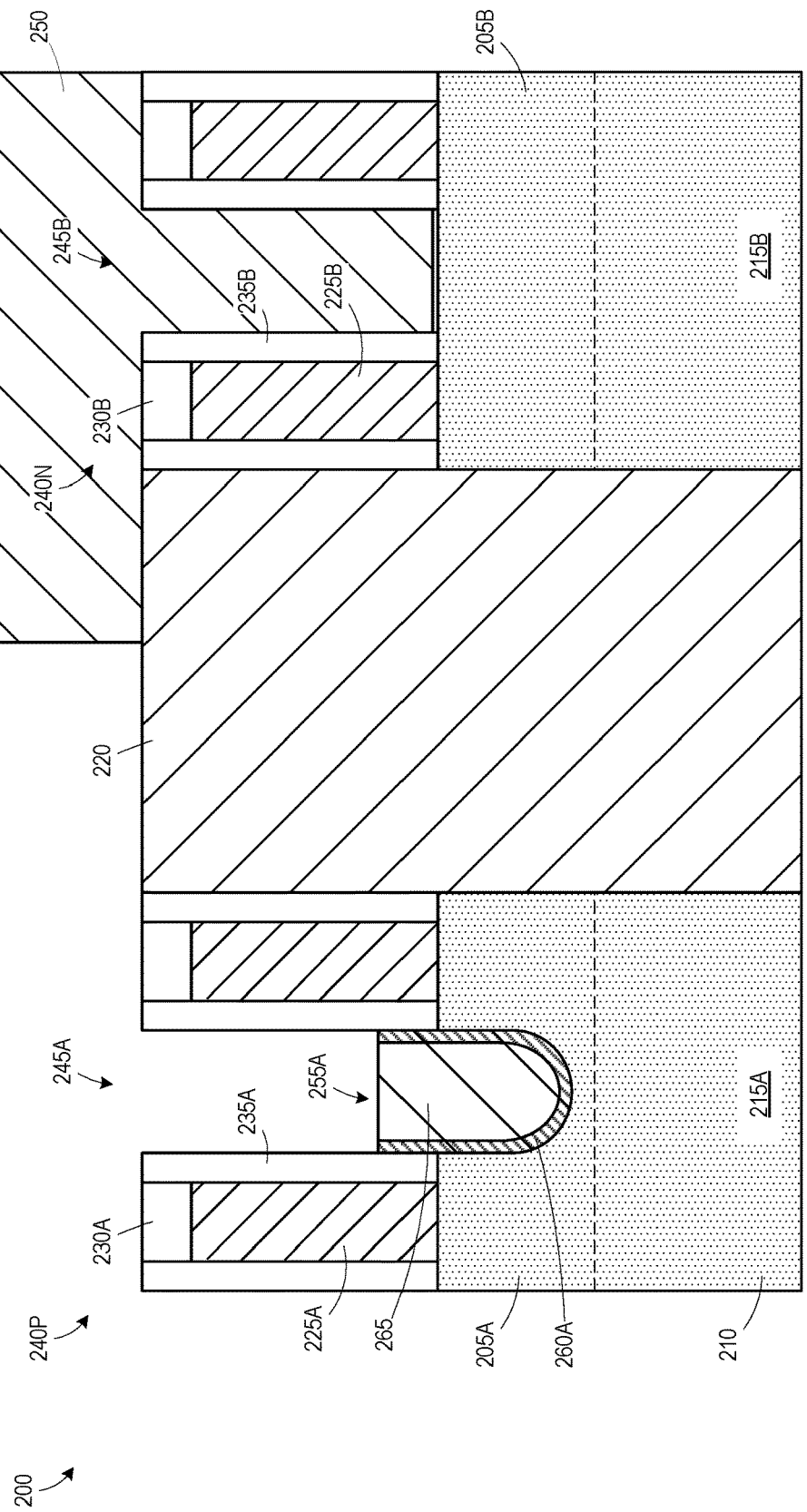

FIG. 2C illustrates the product 200 after a mask layer 265 (e.g. OPL) was formed in the lower portion of the contact opening 245A and the contact recess 255A. An etch process was performed to remove exposed portions of the first doped liner 260A. The remaining portion of the first doped liner 260A lines at least the contact recess 255A.

Figure 2D:
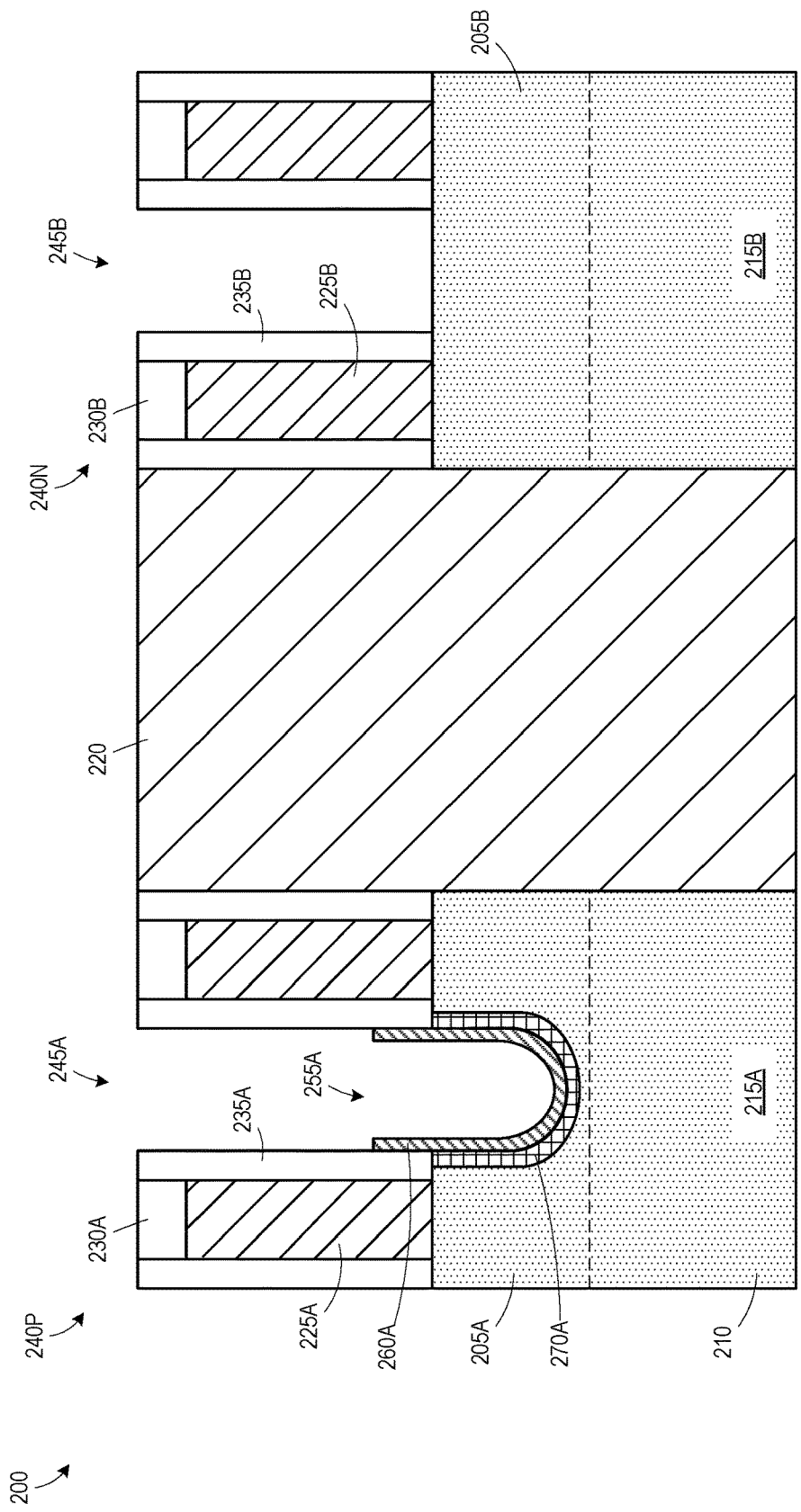

FIG. 2D illustrates the product 200 after several processes were performed. An ashing process was performed to remove the mask layers 250, 265. An anneal process was performed, causing dopants in the first doped liner 260A to diffuse into the portion of the fin 205A adjacent the contact recess 255A, thereby defining a doped contact extension region 270A (e.g., P-doped) in the fin 205A.

Figure 2E:
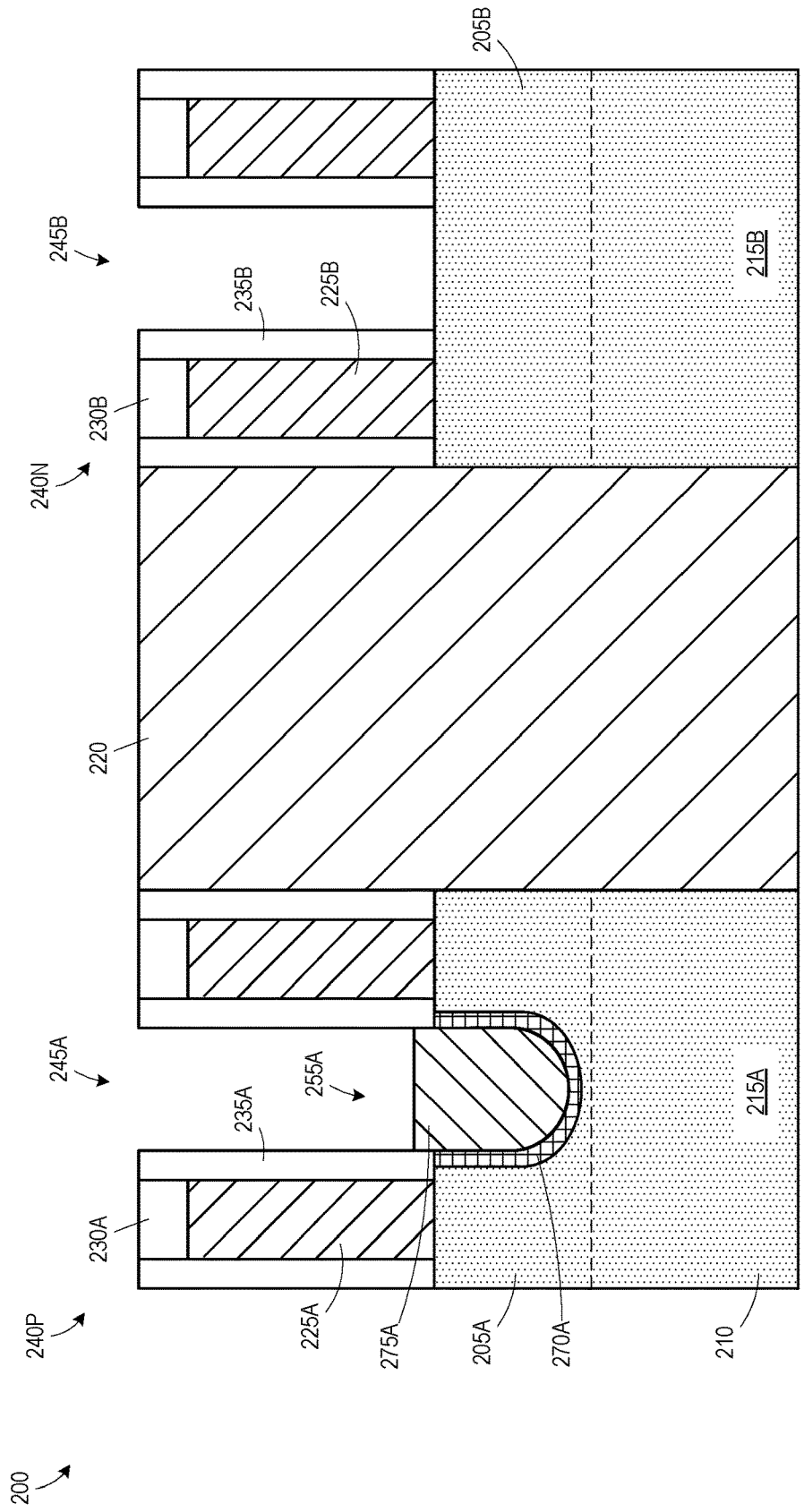

FIG. 2E illustrates the product 200 after an etch process was performed to remove the first doped liner 260A and an epitaxial growth process was performed to define a first source/drain region 275A (e.g., P-doped silicon germanium) in the fin 205A to fill the contact recess 255A. In some embodiments, the first source/drain region 275A may overfill the contact recess 255A to define a raised configuration.

Figure 2F:
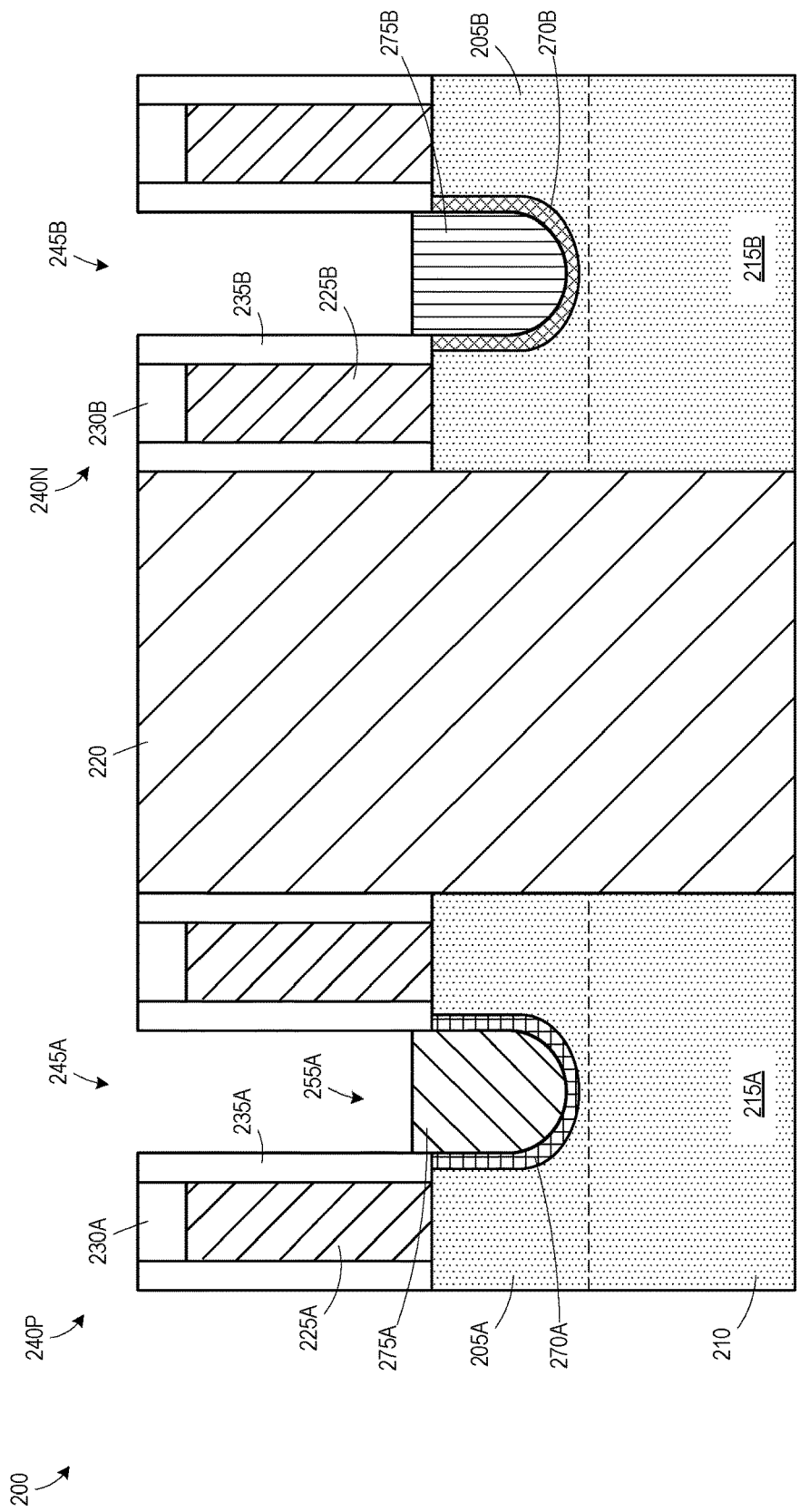

FIG. 2F illustrates the product 200 after the steps of FIGS. 2B-2E were repeated for the NMOS device 240N to define a doped contact extension region 270B (e.g., N-doped) in the fin 205B and a second source/drain region 275B (e.g., N-doped silicon) in the fin 205B adjacent the doped contact extension region 270B. For the NMOS device 240N, a second doped liner (not shown) may be formed in the corresponding contact recess using phosphorous silicate glass (PSG).

Additional process steps may be performed to complete the fabrication of the product illustrated in FIG. 2F, such as the replacement of the gate structures 225A, 225B with a high-k gate insulation layer and a metal gate electrode and the formation of metallization layers with associated lines and vias.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a first contact opening between two adjacent gate structures formed above a first fin, the first contact opening exposing a first region of the first fin;
   forming a first contact recess in the first region;
   forming a first doped liner in the first contact opening and the first contact recess;
   removing a portion of the first doped liner from an upper portion of the first contact opening;
   performing an anneal process to diffuse dopants from the first doped liner into the first fin to form a first doped contact extension region in the first fin; and
   performing a first epitaxial growth process to form a first source/drain region in the first contact recess.

2. The method of claim 1, further comprising:
   forming a mask layer in the first contact recess and a lower portion of the first contact opening, the mask layer exposing the upper portion of the first contact opening; and
   etching the portion of the first doped liner exposed by the mask layer.

3. The method of claim 1, further comprising removing the first doped liner prior to performing the first epitaxial growth process.

4. The method of claim 1, wherein the first source/drain region overfills the first contact recess.

5. The method of claim 1, further comprising:
   forming a first mask layer exposing the first fin and covering a second fin prior to forming the first doped liner, wherein the first doped liner is formed in the first contact opening and above the first mask layer;
   forming a second mask layer in the first contact recess and a lower portion of the first contact opening, the second mask layer exposing an upper portion of the first contact opening; and
   removing a portion of the first doped liner exposed by the second mask layer from the upper portion and from above the first mask layer.

6. The method of claim 5, further comprising removing the first and second mask layers prior to performing the anneal process.

7. The method of claim 6, further comprising:
   forming a third mask layer exposing the second fin and covering the first fin;
   forming a second contact opening between two adjacent gate structures formed above the second fin, the second contact opening exposing a second region of the second fin;
   forming a second contact recess in the second region;
   forming a second doped liner in the second contact recess, wherein the second doped liner has a first conductivity type opposite a second conductivity type of the first doped liner;
   removing the third mask layer;
   performing an anneal process to diffuse dopants from the second doped liner into the second fin to form a second doped contact extension region in the second fin; and
   performing a second epitaxial growth process to form a second source/drain region in the second contact recess.

8. The method of claim 7, wherein the first source/drain region is doped with dopants of the second conductivity type, and the second source/drain region is doped with dopants of the first conductivity type.

9. The method of claim 7, wherein the first source/drain region comprises silicon germanium, and the second source/drain region comprises silicon.

10. The method of claim 7, wherein the first source/drain region overfills the first contact recess, and the second source/drain region overfills the second contact recess.

11. A method, comprising:
    forming a first mask layer exposing a first fin and covering a second fin;
    forming a first contact opening between two adjacent gate structures formed above the first fin, the first contact opening exposing a first region of the first fin;
    forming a first contact recess in the first region;
    forming a first doped liner in the first contact opening and the first contact recess and above the first mask layer;
    forming a second mask layer in the first contact recess and a lower portion of the first contact opening, the second mask layer exposing an upper portion of the first contact opening;
    removing a portion of the first doped liner exposed by the second mask layer from the upper portion and from above the first mask layer;
    removing the first and second mask layers;
    performing an anneal process to diffuse dopants from the first doped liner into the first fin to form a first doped contact extension region in the first fin; and
    performing a first epitaxial growth process to form a first source/drain region in the first contact recess.

12. The method of claim 11, further comprising:
    forming a third mask layer exposing the second fin and covering the first fin;
    forming a second contact opening between two adjacent gate structures formed above the second fin, the second contact opening exposing a second region of the second fin;
    forming a second contact recess in the second region;

forming a second doped liner in the second contact recess, wherein the second doped liner has a first conductivity type opposite a second conductivity type of the first doped liner;

removing the third mask layer;

performing an anneal process to diffuse dopants from the second doped liner into the second fin to form a second doped contact extension region in the second fin; and performing a second epitaxial growth process to form a second source/drain region in the second contact recess.

13. The method of claim 12, wherein the first source/drain region is doped with dopants of the second conductivity type, and the second source/drain region is doped with dopants of the first conductivity type.

14. The method of claim 12, wherein the first source/drain region overfills the first contact recess.

15. The method of claim 12, wherein the first source/drain region comprises silicon germanium, and the second source/drain region comprises silicon.

16. The method of claim 12, wherein the first source/drain region overfills the first contact recess, and the second source/drain region overfills the second contact recess.

* * * * *